United States Patent [19]
Sasaki et al.

[11] Patent Number: 5,172,335
[45] Date of Patent: * Dec. 15, 1992

[54] SEMICONDUCTOR MEMORY WITH DIVIDED BIT LOAD AND DATA BUS LINES

[75] Inventors: Toshio Sasaki, Hachioji; Osamu Minato, Nishitama; Shigeru Honjiyo, Hachioji; Koichiro Ishibashi, Sumida; Toshiaki Masuhara, Nishitama, all of Japan

[73] Assignee: Hitachi, Ltd., Tokyo, Japan

[ * ] Notice: The portion of the term of this patent subsequent to Jun. 19, 2007 has been disclaimed.

[21] Appl. No.: 727,314

[22] Filed: Jul. 1, 1991

Related U.S. Application Data

[60] Continuation of Ser. No. 499,086, Mar. 26, 1990, abandoned, which is a division of Ser. No. 158,259, Feb. 19, 1988, Pat. No. 4,935,901.

Foreign Application Priority Data

Feb. 23, 1987 [JP] Japan .................................. 62-37901

[51] Int. Cl.$^5$ .............................................. G11C 5/06
[52] U.S. Cl. .................................... 365/63; 365/51; 365/204; 365/230.03; 365/230.06
[58] Field of Search ............... 365/51, 63, 230.03, 365/230.06, 204

[56] References Cited

U.S. PATENT DOCUMENTS

| | | | |
|---|---|---|---|
| 4,542,486 | 9/1985 | Anami et al. | 365/230 |
| 4,554,646 | 11/1985 | Yoshimoto et al. | 365/189 |
| 4,569,036 | 2/1986 | Fujii et al. | 365/230 |
| 4,596,001 | 6/1986 | Baba | 365/189 |
| 4,636,982 | 1/1987 | Takemae et al. | 365/149 |
| 4,691,298 | 9/1987 | Fukuda et al. | 365/189 |
| 4,758,993 | 7/1988 | Takemae | 365/222 |
| 4,796,234 | 1/1989 | Itoh et al. | 365/227 |
| 4,802,132 | 1/1989 | Ohsawa | 365/230 |
| 4,807,189 | 2/1989 | Pinkham et al. | 365/189 |
| 4,935,901 | 6/1990 | Sasaki | 365/230.03 |

OTHER PUBLICATIONS

A 64Kb Full CMOS RAM with Divided Word Line Structure, by Yoshimoto, et al. ISSCC 83 Conference, Feb. 1983.
A 20 ns 64K CMOS Static RAM, Minato, et al., IEEE Journal of Solid-State Circuits, vol. SC-19, No. 6, Dec. 1984, pp. 1008–1013.

*Primary Examiner*—Joseph E. Clawson, Jr.
*Attorney, Agent, or Firm*—Fay, Sharpe, Beall, Fagan, Minnich & McKee

[57] ABSTRACT

A static RAM memory is divided into a plurality of mats (12). Word lines (16) in each pair of mats are accessed by an x-decoder (14). Columns or bit lines are accessed by a y-decoder (20) which selectively connect pairs of bit lines (22) to common data bus segments (24). Transistors (60, 62) connect selected bit lines with a load during a write cycle to stabilize those bit lines and memory cells into which data is written. The x-decoders are connected with near word lines (16a) for addressing a near half of each mat and are operatively connected with remote word lines (16b) for addressing word lines in a remote half of each mat. In this manner, each mat is divided into two effective mats. The bit lines of all the effective mats within an actual mat are connected with the same output data bus segment. A pair of sensing amplifiers (32) is provided for each bit of memory which is accessed concurrently, e.g. eight bits, such that the high and low output of each flip-flop memory cell (18) are both amplified. A pair of driving amplifiers (34) further amplify each high and low output before applying them to an output data bus (38).

6 Claims, 6 Drawing Sheets

SEMICONDUCTOR MEMORY WITH DIVIDED BIT LOAD AND DATA BUS LINES

This applicatin is a continuation of application Ser. No. 07/499,086 filed Mar. 26, 1990, now abandoned, which is a divisional of application Ser. No. 158,259 filed Feb. 19, 1988, now U.S. Pat. No. 4,935,901.

BACKGROUND OF THE INVENTION

The present invention relates to the art of semiconductor memories. It finds particular application in conjunction with static RAMs and will be described with particular reference thereto. It is to be appreciated, however, that the invention may also find application in conjunction with other memory and semiconductor devices.

Heretofore, a random access memory has commonly included a large array of memory cells. The memory cells have been commonly addressed by a combination of a row or x-address and a column or y-address. A word driver or x-decoder received a memory address and enabled a corresponding row or word line of memories to be accessed. A column or y-decoder and a column select switch also received the address and enabled one of the columns. The memory cell at the intersection of the enabled column or bit line and the enabled row or word line could be written into or read. Data read from the cell was conveyed to a common data bus and amplified by sensing amplifiers.

As the memories became larger in scale, an increased number of memory cells were connected to each word line and an increased number of word lines were provided. This increased the current consumption each time a memory was activated and decreased the operating speed. If the word lines were shortened, the number of word lines, hence, the height of the columns would increase resulting in similar problems.

To reduce the power consumption and increase the operating speed, the memory was divided into a plurality of mats. The x-decoder or word driver selected a main word line, i.e. corresponding word line in each mat. Group word logic cells were added to select only a group word line in one of the mats. This reduced the length of the physically enabled word line which reduced power consumption and increased speed.

The length of the word line was further reduced by using double word line architecture. The double word line architecture effectively divided each mat in half such that the effective length of each word line was halved again. See for example, U.S. Pat. No. 4,554,646 issued Nov. 19, 1985 to Yoshimoto, et al.

One of the problems with the double word line architecture is that it made no improvement in the speed or power consumption attributable to the y or column address. To improve the column efficiency, the common data bus was divided into a plurality of segments. In the double word architecture, a segment was provided for each of the effective or half mats. That is, in a memory cell having eight mats which were each effectively divided in two by the double word architecture, sixteen common data bus segments were required. A corresponding large number of sensing amplifiers were required to connect each common data bus segment with an output data bus. For an eight bit memory, sixteen sensing amplifiers were commonly required per segment. These amplifiers not only increased the complexity of the memory, but also had a deleterious effect on its speed and power consumption.

The present invention contemplates a new and improved memory construction which overcomes the above referenced problems and others.

SUMMARY OF THE INVENTION

In accordance with one aspect of the present invention, a semiconductor memory with a divided common data bus is provided. The memory includes a first plurality of memory mats, each mat including a plurality of memory cells. A y-decoder selects bit lines to address a column of the memory cells. A double word x-decoder selects group word lines such that each mat is divided into at least two effective mats. A first plurality of common data bus segments are provided such that the number of common data bus segments matches the number of memory mats. Each of the common data bus segments is connected with the cells of one of the memory mats. A plurality of sensing amplifiers connects each common data bus segment with a output data bus.

In accordance with a more limited aspect of the present invention, the sensing amplifiers include at least a first amplification stage having two inputs for receiving a high and a low output from the addressed memory cell and two outputs. A second amplifier stage has two inputs for receiving the two outputs of the first stage and two outputs for driving a output data bus.

In accordance with another aspect of the present invention, a semiconductor memory is provided which has a divided bit line control. The memory includes a plurality of memory mats each of which includes a plurality of memory cells. An x-decoder means selects word lines to address a row of memory cells. A plurality of load control means selectively connects bit line loads with a selected subset of columns during a write cycle in accordance with a received address.

One advantage of the present invention is that it reduces power consumption in large scale, semiconductor memories.

Another advantage of the present invention is that it increases operating speed.

Another advantage of the present invention is that it reduces parasitic capacitance.

Still further advantages of the present invention will become apparent to those of ordinary skill in the art upon reading and understanding the following detailed description of the preferred embodiment.

BRIEF DESCRIPTION OF THE DRAWINGS

The invention may take form in various parts and arrangements of parts or in various steps and arrangements of steps. The drawings are only for purposes of illustrating the preferred embodiments and are not to be construed as limiting the invention.

DETAILED DESCRIPTION OF THE PREFERRED EMBODIMENTS

Figure 1:
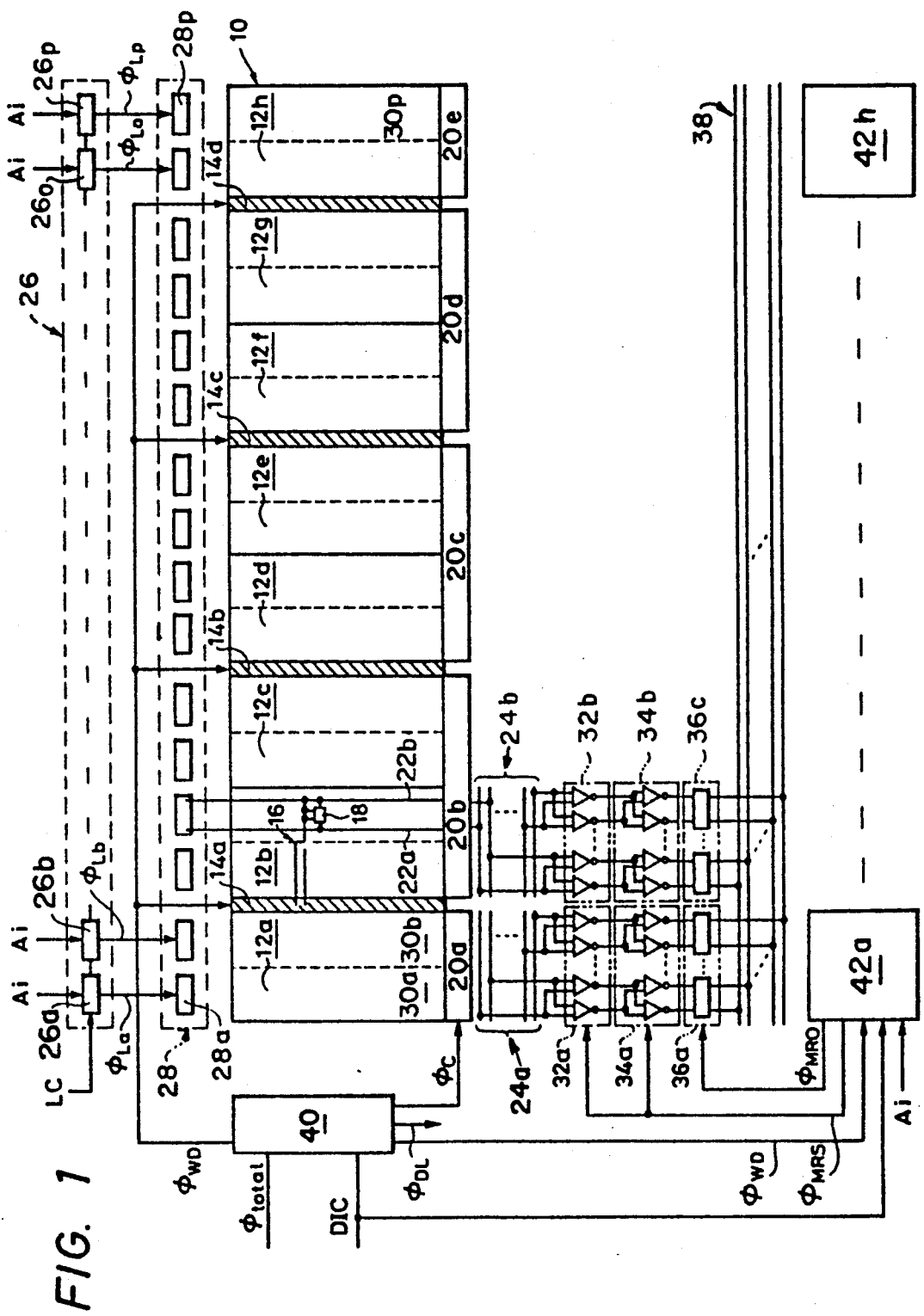
FIG. 1 is a diagrammatic illustration of a static RAM memory in accordance with the present invention.

With reference to FIG. 1, the static RAM includes a large array 10 of memory cells, e.g. one million. The memory array is divided into eight mats 12a–12h by four x-decoder or Word driver means 14a–14d. Each x-decoder means 14 controls a plurality of word lines, such as word line 16 extending across one of the mats 12. Each word line provides an enable signal to a row of memory cells, including a memory cell 18.

A y-decoder means 20a–20e selects a plurality of bit lines 22 to be connected to each of common data bus segments 24a–24e. A plurality of load control means 26a–26p selectively connect each of a plurality of load devices 26a–28p to the bit lines of a selected mat during a write mode. The load control means 26 generates load switching signals $\phi_{La}\int\phi_{Lp}$ in response to an address signal $A_1$ and a load control signal LC to enable the selected bit load devices.

In the preferred embodiment, each of the mats 12 has an aspect ratio or a bit line to word line ratio of 1:4. For a million bit memory which has 128 kilowords by eight bits, the mats are each 512 bits × 2048 bits. This shortens the columns. That is, the length of the bit lines is shortened to 512 bits. Which decreases the load capacity of the bit lines. By using double word architecture, each word line is reduced to half the width of the mat. That is, regarding power consumption and speed, each mat 12 is divided into two effective mats 30, each effective mat being 1024 bits. A first portion 16a of the Word line 16 accesses one half of the bits across one mat and a second word line portion 16b accesses the other half. In the preferred embodiment, one bit line load device 28 is provided for each effective mat to reduce the power consumption in the write mode still further.

The y-decoder means or arrays 20 interconnect each of the eight mats 12 with eight corresponding common data bus segments 24. That is, each pair of effective mats, e.g. effective mats, 30a and 30b is interconnected with one of the eight common data bus segments. The division of the common data bus into eight segments decreases the capacitance and resistance, particularly in the diffusion and wiring layers of the MOS transistors of the switching arrays 20. Each of the common data bus segments includes two lines per bit. For an eight bit memory structure, sixteen lines are provided. This enables eight bits to be read out or written in concurrently.

Each of eight sensing amplifier arrays 32 includes a sensing amplifier for each line of the corresponding common data bus segment. For an eight bit structure, sixteen sensing amplifiers are provided for each common data bus segment. Each sensing amplifier is connected with an output data bus driving amplifier of second stage amplifier arrays 34. An array 36 of multiplexers is connected between each pair of the second stage amplifiers and an output data bus 38.

A clock generator 40 generates clock signals which control the x-decoder 44 and the y-decoder 20, directly, and which control the amplifiers 32, 34 and the multiplexers 36, indirectly, through a plurality of amplifier derive circuits 42. The amplifier drive circuits 45 control the operation of the sense and driver amplifiers such that only the amplifiers connected to the common data bus segment receiving read data are enabled. Operation of only the amplifiers which amplify the read data reduces power consumption.

Figure 2:
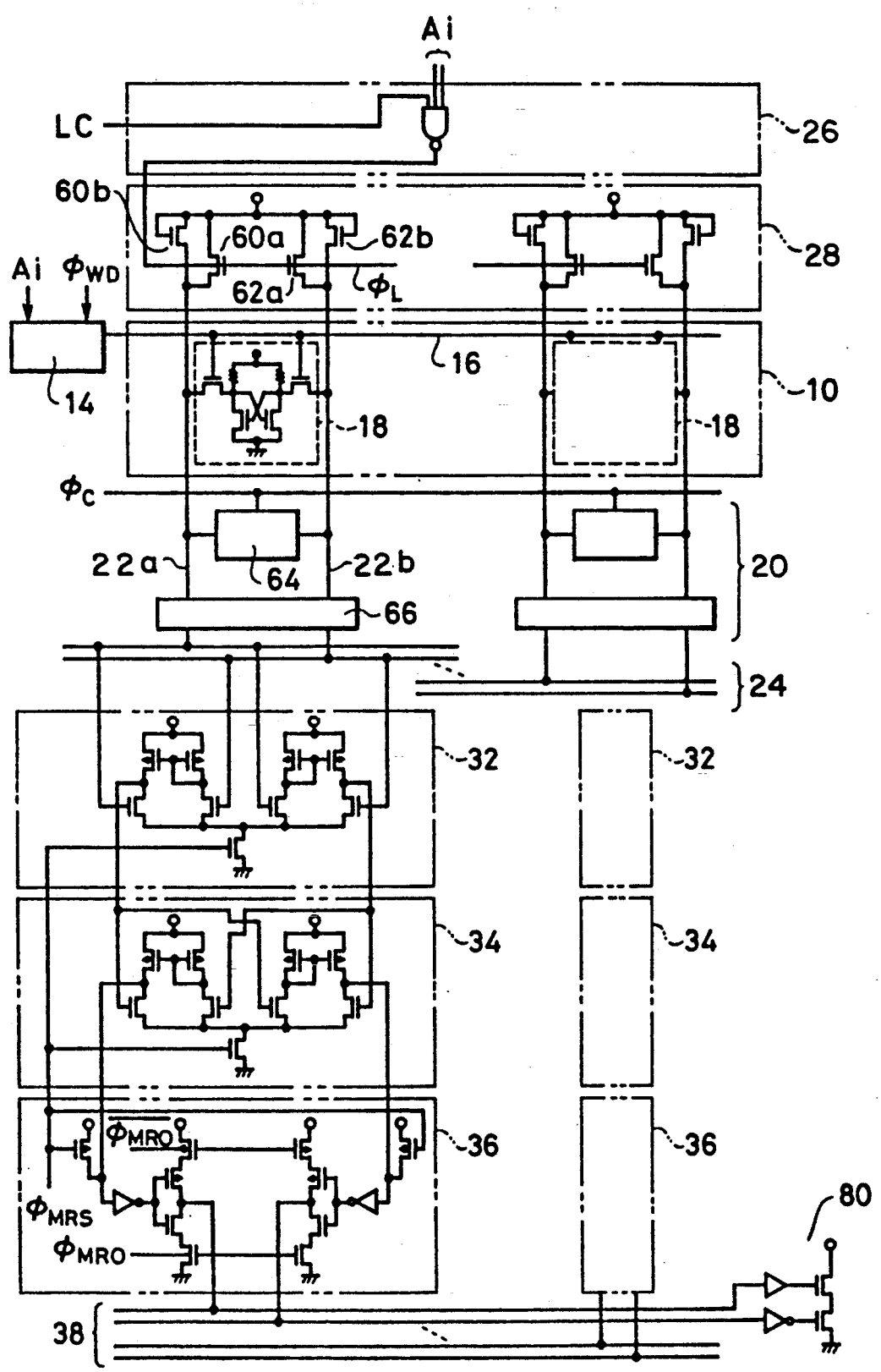
FIG. 2 provides a more detailed schematic representation of the divided line control, divided common data bus, and sensing amplifiers of an alternate embodiment of the static RAM of FIG. 1 which uses single word architecture.

With reference to FIG. 2, the memory cells 18 each include a flip-flop circuit. That is, each memory cell has two outputs, a high output and a low output. Each time the flip-flop is stepped, the high and low outputs are reversed. The two bit lines 22 are each connected with a different one of the two flip-flop outputs. In this manner, each sampled bit includes a high signal and a low signal. The order of the high and low signals is indicative of whether a digital "1" or a "0" is stored in the cell.

Figure 3:
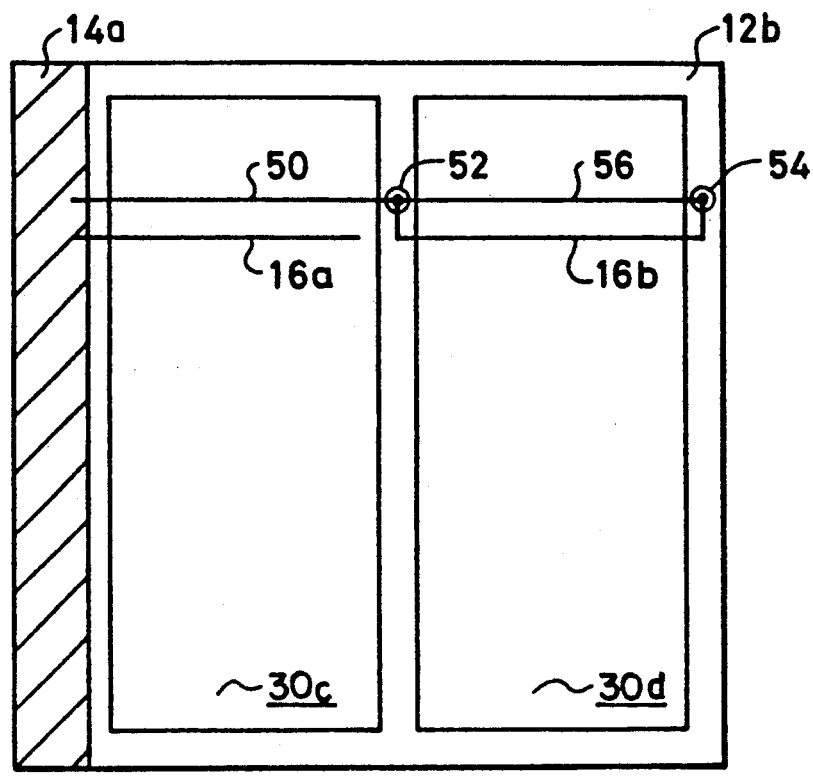
FIG. 3 illustrates a double word architecture control system for a static RAM.

With reference to FIG. 3, the dual word architecture of the word line 16 reduces the DC current flow to the bit line load device 28. The x-decoder or word driver means 14 controls a conventional word line 16a for selecting the memory cells in a near end effective mat 30a. A third wiring layer 50 different from the word line extends from the x-decoder to a contact point 52. A second word line 16b is connected With the contact point 52. In this manner, the x-decoder 14 can select memory cells in the remote end effective mat 30b by sending Word signals to the Word line 16b through the third layer wire 50. In order to minimize delay on the word line 16b, it is connected with a remote contact point 54 which is connected with the first contact point 52 by another third layer wire segment 56. Alternately, the third layer wiring segment 56 may extend from the contact point 54 to ground, rather than to contact point 52. Grounding contact point 54 removes the effects of noise which is attributable to floatation of the wiring capacitance. Of course, the memory cells in the remote mat 30b can be accessed with the third layer wire segment 56 removed.

In this manner, the number of memory cells selected by each word line is halved, e.g. reduced from 256 to 128. This reduction again reduces electrical power consumption. Moreover, the third wiring layer can provide the ground contact for the memory cells instead of conventional ground wiring on the lower layers. This enables the memory cells to be packed more closely, reducing the size of the memory chip. This can also reduce the wiring capacitance and resistance.

With continuing reference to FIG. 2, in the write mode, each bit line load devices 25 applies a load across each column of memory cells in a selected effective mat 30. Each bit load device 28 includes two pairs of n-channel MOS transistors 60a, 60b and 62a, 62b. When the transistors 60a, 62a are switched conductive, the bit line load devices stabilize the data of the corresponding columns of memory cells during a reading operation and decrease the electrical power consumption during the writing operation.

Figure 4:
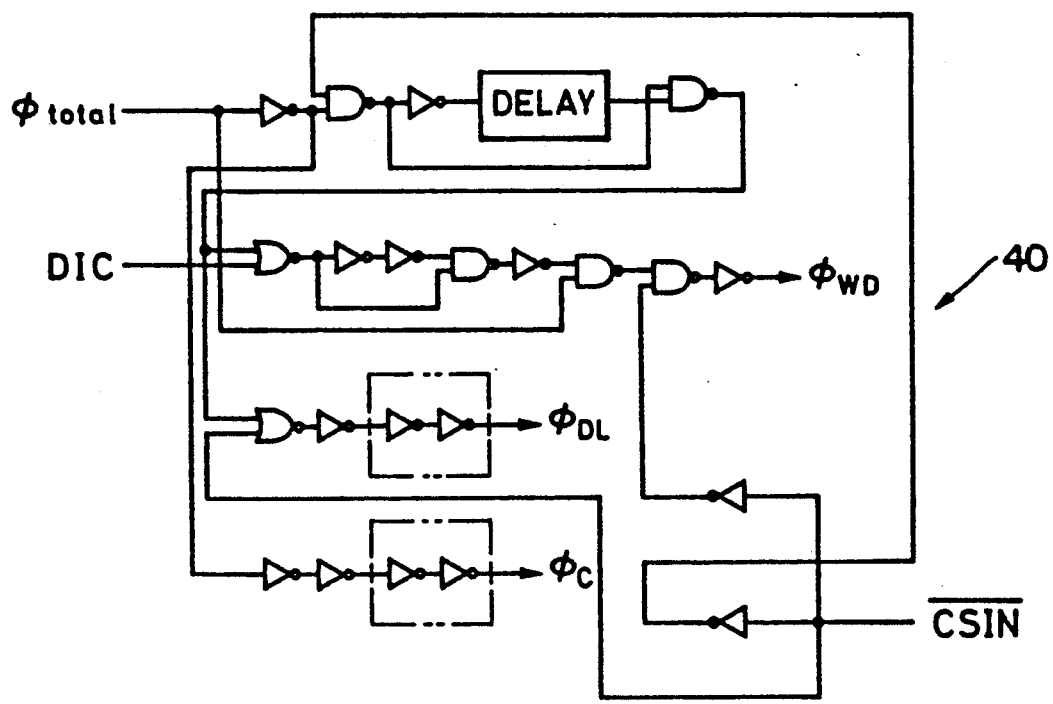
FIG. 4 is a detailed schematic representation of a clock generator for the static RAM of FIG. 1.

With reference to FIG. 4, a clock signal $\phi_{TOTAL}$ is formed based on an address change rate and a data input control or activating signal DIC is based on a write/read enable signal. In response to these signals, the clock generator 40 generates a chip selection related signal CSIN, a word line activating signal $\phi_{WD}$, a precharge signal $\phi_C$, and a data latch signal $\phi_{DL}$. A load switching signal $\phi_L$ controls the load transistors 60a, 62a to connect a load to the selected effective mat of bit lines. The memory can be operated at higher speeds when the signal $\phi_L$ is divided in accordance with the division of the word line. That is, during the writing operation, the signal $\phi_L$ only turns the transistors of the selected bit line non-conductive. This division causes the operating speed of the signal $\phi_L$ to increase such that the high speed bit line recovers voltage and is equalized. The word line driver or x-decoder means 14 is driven by an address signal $A_i$ and by the word line activating signal $\phi_{WD}$.

With reference again to FIG. 2, a potential leveling or precharge circuit 64 is activated by the $\phi_c$ signal during a read cycle to maintain the potential on the bit lines at a constant level. Maintaining the potential constant enables the inverted data high and low signals to be read at high speeds.

Figure 5:
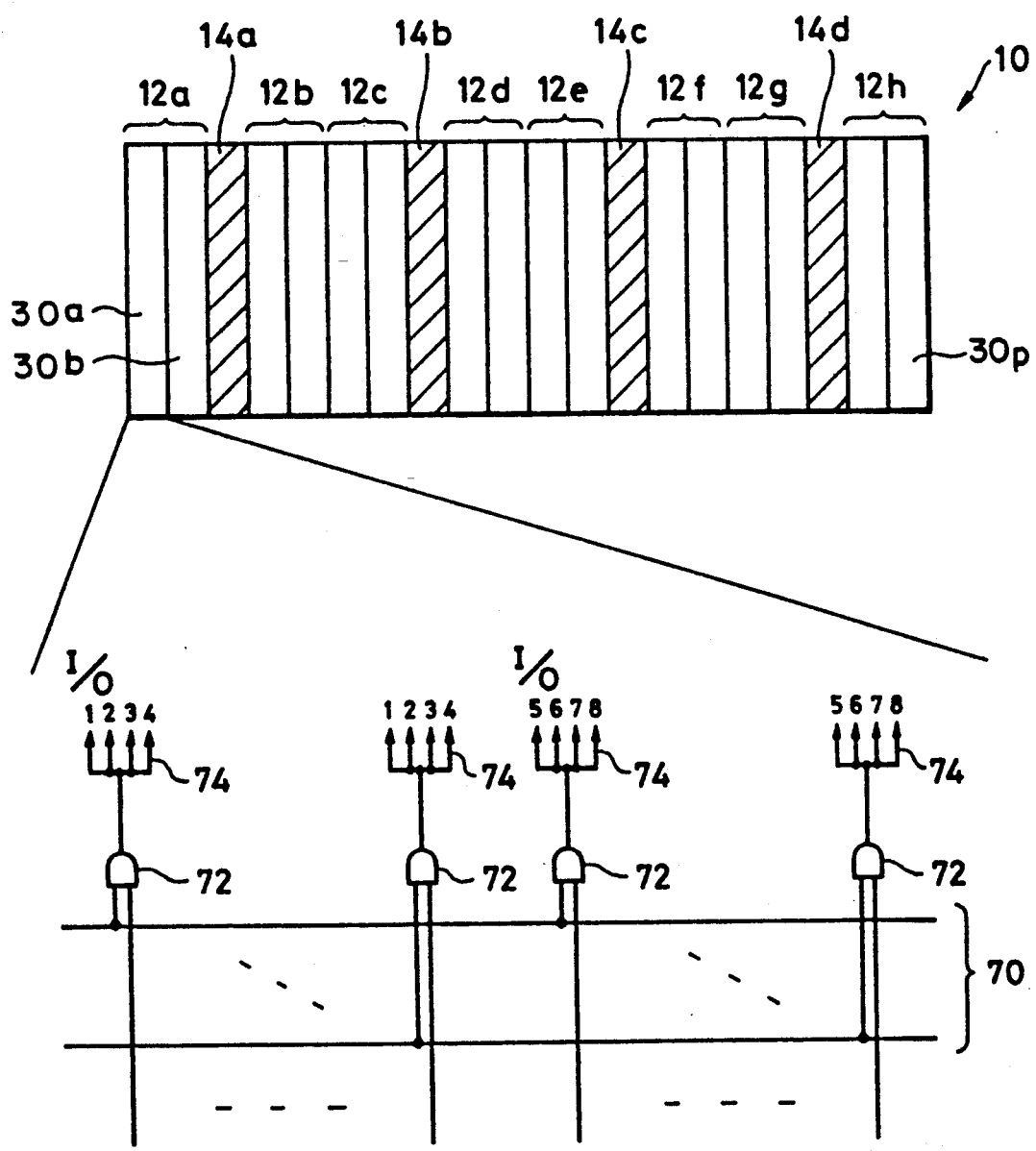
FIG. 5 illustrates a control system for enabling words of the static RAM.

It will be seen that placing a high signal on the word line 16 connects the output of all the flip-flop circuits or memory cells of one row to the respective bit lines. A switching transistor pair 66 of the y-decoder means 20 enables the data only on a selected pair of the bit lines to be transmitted or transferred to the divided common data bus 24. For a memory that is eight bits deep, each memory cell includes eight flip-flop circuits. The high signal on the word line connects all eight flip-flops with the bit lines. The eight pairs of enabled switching transistors 66 connects the pairs of bit lines for the eight flip-flops with respective pairs of lines of the common data bus 24. In this manner, all eight flip-flops are read concurrently. With reference to FIG. 5, address signals that designate the column are received on line 72. Column decoder circuits 72 select the plurality of memory cells that provide the plurality of bits of the addressed word. More specifically, to the illustrated eight bit embodiment, in-out or I/O signals 74 select the switching transistors of switching arrays corresponding to the eight bits or cells of the words in the selected column. Memory cells corresponding to the first four I/0 signals are accessed by one of the input/output terminals and cells I/O 5 to 8 are selected by the other. With this structure, the eight memory cells of one eight bit word are connected to a single word line. The delay when the data is produced can be set to be between two and three nanoseconds between in/outs. Accordingly, a peak current that flows into the output transistor can be analogously divided to reduce the effective noise upon the internal circuits.

Figure 6:
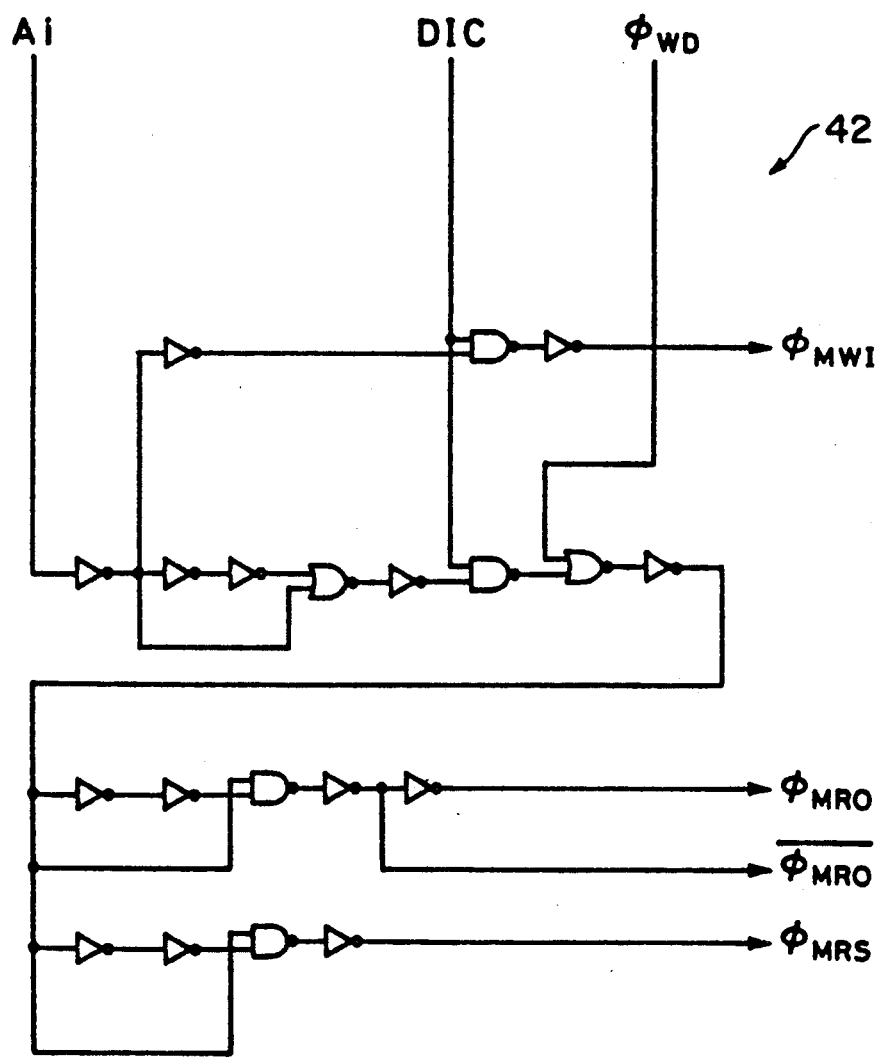
FIG. 6 is a schematic illustration of an amplifier drive circuit of the static RAM of FIG. 1.

With reference to FIG. 6, the amplifier drive circuits 42 enables only selected sensing and second stage amplifiers. By enabling only the amplifiers that are needed for the read memory cell, power consumption is minimized. The amplifier drive circuit 42 receives the address signals $A_i$ the data input control signal DIC, and the word line signal $\phi_{WD}$. From these address and timing related signals, the amplifier drive circuit generates amplifier control signals $\phi_{MRS}$, multiplexer control signals $\phi_{MRO}$, and a data writing circuit activating signal $\phi_{MWI}$.

Referring again to FIG. 2, in the read mode, the high and low signals on the bit lines 22a and 22b are conveyed by the data bus segment 24 to the sensing amplifiers 32. In the preferred embodiment, the sensing amplifiers or first stage of amplification provides a pair of mirror current amplifiers which are enabled by the amplifier enable signals $\phi_{MRS}$ from the drive circuit 42. The second stage or drive amplifiers 34 are also of the current mirror type and are also enabled by the $\phi_{MRS}$ signal.

The multiplexer is stepped by the multiplexer control signals $\phi_{MRO}$ and $\phi_{MRS}$ to connect the output of the sense amplifiers to the output data bus 32. The output data bus has a pair of wires or leads corresponding to each bit. The pair is read concurrently. More specifically, each pair of wires is connected to a combining circuit 80 for combining the high and low pulse signal from each flip-flop into digital ones and zeros.

Figure 7:
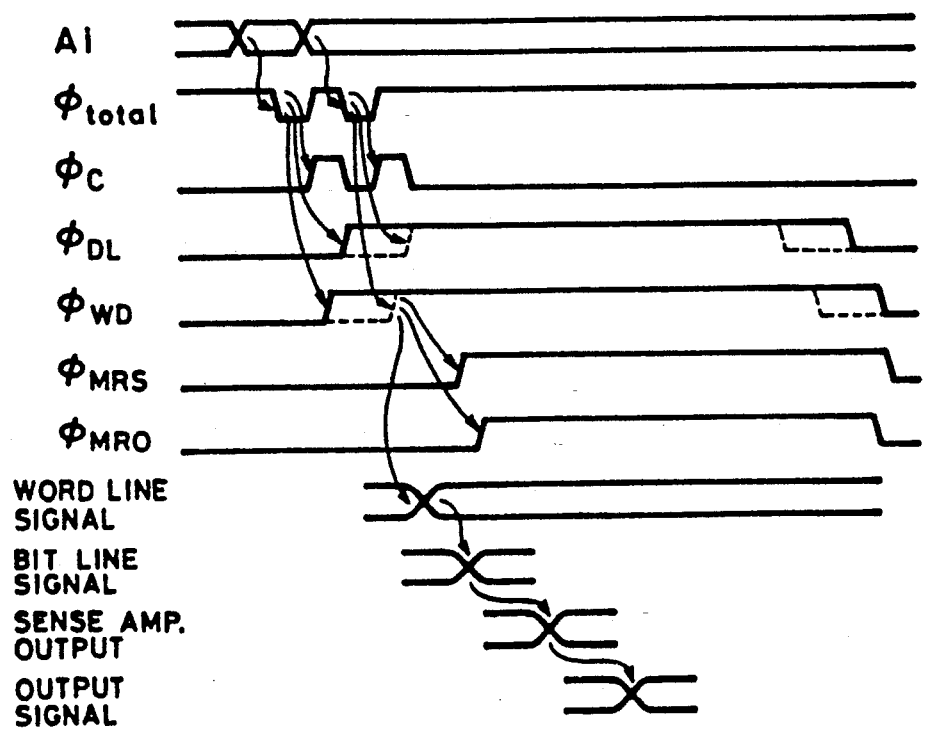
FIG. 7 is a timing chart which illustrates operation of the static RAM of FIG. 1 during a read mode; and, FIG. 8 is a time chart illustrating operating sequences of the static RAM of FIG. 1 during a write mode

With particular reference to FIG. 7 and continuing reference to FIGS. 2, 4, and 6 an input address signal $A_1$ is received causing the chip select related signal CSIN to assume a low state. The clock signal $\phi_{TOTAL}$ is formed from the skew or change portions of the signal $A_i$. The circuit of FIG. 4 produces the precharge signal $\phi_c$ but inverting and delaying the $\phi_{TOTAL}$ signal for application to the y-decoder means 20. The data latch signal $\phi_{DL}$ and an x-decoder and word line activating signal $\phi_{WD}$ are created from a leading edge of the $\phi_{TOTAL}$ signal and a delay. The sensing amplifier and driving amplifier signals $\phi_{MRS}$ and $\phi_{MRO}$ are formed in the FIG. 5 circuit by delaying the leading edge of the $A_i$ signal.

When reading data in the memory cells, as the address $A_i$ changes, the precharge signal $\phi_c$ enables the precharge means 64 to precharge or potential equalize all of the bit lines in the selected mat with a selected address signal. The x-decoder and word line activating signal $\phi_{WD}$ activates the x-decoder 14 of the selected mat. This enables the high and low bit line signals to be conveyed to the sensing amplifier 32. The signal $\phi_{MRS}$ enables the sensing amplifier and the drive amplifier such that the bit line signals are amplified twice.

To operate the device at high speeds, the clocks must have appropriate delay times and widths. The rising edge of the clock signal $\phi_{TOTAL}$ determines a minimum width of the precharge signal $\phi_c$. Precharging, of course, affects the reliability. After a predetermined period of time has passed from the change of address, the data latch signal $\phi_{DL}$ assumes a low level to latch the data. Thereafter, the word line signal and the amplifier control signals assume low levels in order to inactivate the remainder of the circuit. The internal circuits operate only for a predetermined duration of time commensurate with a fraction of the read cycle time. In this manner, consumption of electrical power is decreased.

Figure 8:
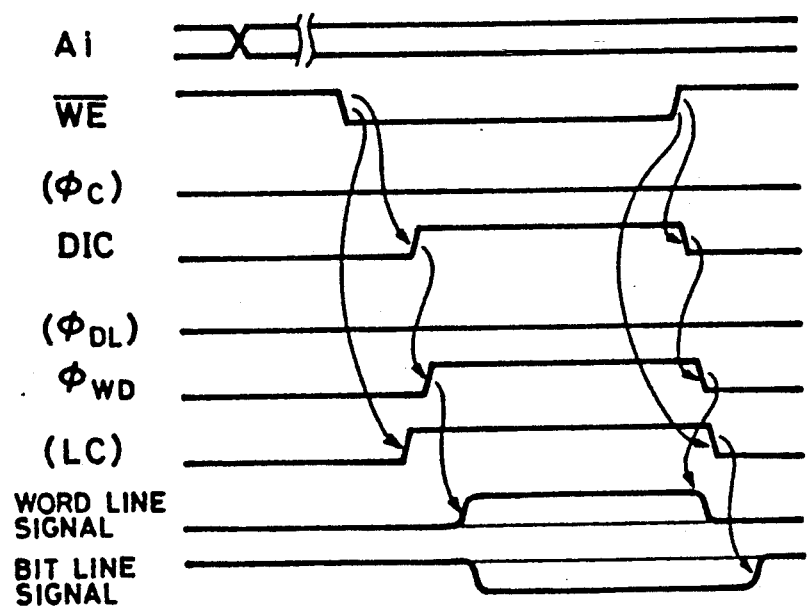

With reference to FIG. 8, in the write mode, the address signal $A_i$ is followed by a write enable signal WE. The data input control signal DIC responds to the write enable signal by assuming a high state. The word line activating signal $\phi_{WD}$ and the corresponding word line assume a high level. The write enable signal WE goes low as the data is transferred from the common data bus segment and written into the selected memory cell by the column switching array 20.

In the Write cycle, the sense amplifiers, the drive amplifiers, and the multiplexers are switched off to conserve power. The write data is directly received in the data latch circuit in the output buffer circuit. The data in the latch circuit is read out when the signal WE is shifted from low to high. Concurrently, the DIC signal and the $\phi_{WD}$ signal assume a low level. This prevents the first and second amplification stages from amplifying and the multiplexers for assuming a deactivated condition, producing unstable outputs, i.e. erroneous outputs. When the writing mode is changed to the reading mode, the load control signal LC is negated. The load of the bit line is rendered conductive by a logic operation on the predetermined address and the LC signal. In this manner, a bit line signal having a large amplitude is quickly precharged and equalized. The LC signal is shifted at high speeds.

Although the invention has been described with reference to an eight bit structure, it is to be appreciated that other multibit structures are applicable, including four bit, sixteen bit, thirty-two bit, and the like.

The invention has been described with reference to the preferred embodiments. Obviously, modifications and alterations will occur to those of ordinary skill in the art upon reading and understanding the preceding specification. It is intended that the invention be construed as including all such alterations and modifications insofar as they come within the scope of the appended claims or the equivalents thereof.

Having thus described the preferred embodiments, the invention is now claimed to be:

1. In a divided mat semiconductor memory which includes: a plurality of memory mats, each mat divided into a first mat part and a second mat part, and each mat part including a plurality of memory cells; a plurality of bit lines, each of which addresses a column of memory cells of one of the first and second mat parts; a plurality of word lines divided into first word line fractions which each address only memory cells in rows of the first mat part and second word line fractions which each address only memory cells of rows of the second mat part; a y-decoder means for selecting along the bit lines; an x-decoder means for selecting among the first word line fractions and the second word line fractions, the first mat part being in closer physical proximity to the x-decoder means than the second mat part; THE IMPROVEMENTS COMPRISING:
   (1) the x-decoder means (14) being connected directly with the first word line fractions (16a) without intervening logic devices connected electrically between the x-decoder means and the first word line fractions for addressing only memory cells included in the first mat part (30a); and,
   (2) a wiring means (50) for directly connecting the x-decoder means (14) across the first mat part (30a) to the second word line fractions electrically between the x-decoder means and the second word line fractions for addressing only memory cells included in the second mat part (30b), the wiring means (50) being electrically isolated from the first word line fractions (16a).

2. A semiconductor memory comprising:
a plurality of memory mats, each mat is divided into a first mat part (30a) and a second part (30b), and each mat part including a plurality of memory cells;
a plurality of bit lines which address columns of the memory cells;
a plurality of first word line fractions (16a) which address only memory cells of rows of the first mat part;
a plurality of second word line fractions (16b) which address only memory cells of rows of the second mat part, the second word line fractions having electrically isolated from the first word line fractions;
a y-decoder means for selecting among the bit lines;
an x-decoder means (14) for selecting among the first and second word line fractions, the first mat part being in closer physical proximity to the x-decoder means than the second mat part, the x-decoder means being connected directly with the first word line fractions without intervening logic devices for addressing memory cells included in the first mat part;
wiring segments (50), which are different electrical structures than the first word line fractions (16a), connecting the x-decoder means (14) across the first mat part (30a) without any logic devices electrically connected between the x-decoder means and the wiring segments; and
a plurality of electrical contact points (52), each electrical contact point extending directly between one of the wiring segments (50) and one the second word line fractions (16b) to provide direct electric communication therebetween without any logic devices electrically connected between the wiring segments and the second word line fractions, such that the x-decoder means directly addressed memroy cells in the second mat part (30b) through the wiring segments (50) without any logic devices electrically connected between the x-decoder means (14) and the second word line fractions (16b).

3. A divider mat semiconductor memory comprising:
a plurality of memory mats, each mat being divide dinto a first mat part (30a) and a second mat part (30b), and each mat part including a plurality of memory cells;
a plurality of bit lines, each bit line addressing a column of memory cells of one of the first and second mat parts;
a plurality of first word line fractions (16a), each first word line fraction addressing a row of memory cells of the first mat part only;
a plurality of second word line fractions (16b), each second word line fraction addressing rows of memory cells of the second mat part only;
a y-decoder means for selecting among the plurality of bit lines;
an x-decoder means for selecting among the first and second word line fractions, the first mat part being in closer physical proximity to the x-decoder means than the second mat part, the x-decoder means being connected directly with the first word line fractions without intervening logic devices for addressing only memory cells included in the first mat part;
first wiring segments (50) connected directly with the x-decoder means, extending over the first mat part (30a), and connected by the first contact points (52) directly with first ends of the second word line fractions (16b) without logic devices electrically connected between the x-decoder means and the second word line fractions; and
second working segments (56) extending over the second mat part (30b) and connected by second contact points (54) directly with second ends of the second word line fractions (16b) without logic devices electrically connected between the second wiring segments (56) and the second word line fractions (16b).

4. In the divided mat semiconductor memory of claim 1, THE FURTHER IMPROVEMENTS COMPRISING the wiring means including:
a plurality of first wiring segments, each first wiring segment extending across the first mat part and directly connecting the x-decoder means with the second word line fractions without active electrical devices connected with the first wiring segments between the x-decoder means and the second word line fractions; and a plurality of second wiring segments, each second wiring segment being connected with one of the first wiring segments and extending across the second mat part.

5. A divided mat semiconductor memory comprising:
  a plurality of memory mate, each mat divided into a first mat part and a second mat part, and each mat part including a plurality of memory cells, the first mat part being in closer physical proximity to the x-decoder means than the second mat part;
  a plurality of bit lines, each bit line concurrently addresses a memory cell column of one of the first and second mat parts;
  a plurality of word lines divided into (i) electrically isolated first word line fractions, each of which addresses a memory cell row of the first mat part only, and (ii) second word line fractions, each of which addresses a memory cell row of the second mat part only;
  a y-decoder means for selecting among the bit lines;
  an x-decoder means for selecting among the first and the second word line fractions, the x-decoder means being connected directly and ungated with the first word line fractions for addressing each row of memory cells of the first mat part only, the x-decoder means being connected directly with the first line fractions without intervening gating devices connected electrically between the x-decoder means and the first word line fractions; and,
  a wiring means for directly and ungatedly connecting the x-decoder means across the first mat part to the second word line fractions without intervening gating devices connected electrically between the x-decoder means and the second word line fractions for addressing each row of memory cells of the second mat part only, the wiring means being electrically isolated from the first word line fractions.

6. A divided mat semiconductor memory comprising:
  a plurality of memory mats, each mat divided into a first mat part and a second mat part, and each mat part including a plurality of memory cells, the first mat part being in closer physical proximity to the x-decoder means than the second mat part;
  a plurality of bit lines, each bit line concurrently addresses a memory cell column of one of the first and second mat parts;
  a plurality of word lines divided into electrically isolated first word line fractions and second word line fractions, each first word line fraction addresses a memory cell row of the first mat part only and each second word line fraction addresses a memory cell row of the scond mat part only;
  a y-decoder means for selecting among the bit lines;
  an x-decoder means for selecting among the first and the second word line fractions, the x-decoder means being connected directly with the first word line fractions for addressing each memory cell row of the first mat part only, the x-decoder means being connected directly with the first line fractions without intervening driver devices connected electrically between the x-decoder means and the first word line fractions; and
  a wiring means for directly connecting the x-decoder means across the first mat part to the second word line fractions without intervening driver devices connected electrically between the x-decoder means and the second word line fractions for addressing each memory cell row of the second mat part only, the wiring means being electrically discrete from the first word line fractions.

* * * * *

UNITED STATES PATENT AND TRADEMARK OFFICE
CERTIFICATE OF CORRECTION

PATENT NO. : 5,172,335

DATED : December 15, 1992

INVENTOR(S) : Toshio Sasaki, et al.

It is certified that error appears in the above-identified patent and that said Letters Patent is hereby corrected as shown below:

Claim 2, column 7, line 57, delete "having" and substitute therefor --being--.

Claim 2, column 8, line 14, delete "addressed" and substitute therefor --addresses--.

Claim 3, column 8, line 20, delete "divider" and substitute therefor --divided--.

Claim 3, column 8, lines 21-22, delete "divide dinto" and substitute therefor --divided into--.

Claim 3, column 8, line 51, delete "working" and substitute therefor --wiring--.

Claim 5, column 9, line 6, delete "mate" and substitute therefor --mats--.

Signed and Sealed this

Twelfth Day of October, 1993

Attest:

BRUCE LEHMAN

*Attesting Officer*      *Commissioner of Patents and Trademarks*